(12) United States Patent
Lee (10) Patent No.: US 10,930,702 B2
(45) Date of Patent: Feb. 23, 2021

(54) MAGNETIC MEMORY DEVICES

(71) Applicant: Samsung Electronics Co., Ltd., Suwon-si (KR)

(72) Inventor: Dongkyu Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 63 days.

(21) Appl. No.: 16/444,541

(22) Filed: Jun. 18, 2019

(65) Prior Publication Data

US 2020/0161368 A1 May 21, 2020

(30) Foreign Application Priority Data

Nov. 19, 2018 (KR) .................. 10-2018-0142748

(51) Int. Cl.
| | |
|---|---|
| H01L 43/00 | (2006.01) |
| H01L 27/22 | (2006.01) |
| H01L 43/02 | (2006.01) |
| H01L 43/08 | (2006.01) |

(52) U.S. Cl.
CPC .......... *H01L 27/224* (2013.01); *H01L 43/02* (2013.01); *H01L 43/08* (2013.01)

(58) Field of Classification Search
CPC ...... H01L 27/224; H01L 27/222; H01L 43/08
See application file for complete search history.

(56) References Cited

U.S. PATENT DOCUMENTS

| | | | | |
|---|---|---|---|---|
| 7,349,187 B2* | 3/2008 | Parkin | ............. | B82Y 10/00 257/E43.004 |
| 7,394,626 B2* | 7/2008 | Fukumoto | ............. | B82Y 25/00 257/E43.004 |
| 8,670,271 B2* | 3/2014 | Zheng | ............. | B82Y 25/00 365/173 |
| 9,406,874 B2* | 8/2016 | Kula | ............. | G11C 11/161 |
| 9,691,458 B2 | 6/2017 | Ralph et al. | | |
| 9,793,469 B2 | 10/2017 | Kato et al. | | |
| 10,483,320 B2* | 11/2019 | Sun | ............. | G11B 5/3909 |
| 10,672,611 B2* | 6/2020 | Rizzolo | ............. | H01L 21/0337 |

(Continued)

FOREIGN PATENT DOCUMENTS

| | | |
|---|---|---|
| EP | 3249705 A1 | 11/2017 |
| JP | 5448242 B2 | 3/2014 |

(Continued)

*Primary Examiner* — Nicholas J Tobergte
(74) *Attorney, Agent, or Firm* — Harness, Dickey & Pierce, P.L.C.

(57) ABSTRACT

A magnetic memory device may include magnetic tunnel junction patterns on a substrate, a conductive line extending between the substrate and the magnetic tunnel junction patterns and in contact with bottom surfaces of the magnetic tunnel junction patterns, and a bottom pattern located between the conductive line and the substrate and in contact with a bottom surface of the conductive line. The material of the conductive line may have a first lattice constant, and the material of the bottom pattern may have a second lattice constant that is less than the first lattice constant of the conductive line. Alternatively or additionally, the bottom pattern includes a metal nitride, and a nitrogen content of the bottom pattern is higher than a metal element content of the metal element.

20 Claims, 11 Drawing Sheets

(56) References Cited

U.S. PATENT DOCUMENTS

| | | | |
|---|---|---|---|
| 2004/0188732 A1* | 9/2004 | Fukuzumi | H01L 27/228 257/295 |
| 2005/0276099 A1* | 12/2005 | Horng | G11C 11/1675 365/158 |
| 2012/0023386 A1* | 1/2012 | Oh | G11C 11/161 714/769 |
| 2017/0076769 A1 | 3/2017 | Shirotori et al. | |
| 2017/0148848 A1 | 5/2017 | Ahn et al. | |
| 2018/0114557 A1 | 4/2018 | Park et al. | |
| 2018/0159024 A1 | 6/2018 | Buyandalai et al. | |
| 2018/0190336 A1 | 7/2018 | Shirotori et al. | |

FOREIGN PATENT DOCUMENTS

| | | |
|---|---|---|
| JP | 6054326 B2 | 12/2016 |
| JP | 2017-059594 A | 3/2017 |
| KR | 101729383 B1 | 4/2017 |
| KR | 10-2017-0060284 A | 6/2017 |

* cited by examiner

MAGNETIC MEMORY DEVICES

CROSS-REFERENCE TO RELATED APPLICATION

This U.S. non-provisional patent application claims priority under 35 U.S.C. § 119 to Korean Patent Application No. 10-2018-0142748, filed on Nov. 19, 2018, in the Korean Intellectual Property Office, the disclosure of which is hereby incorporated by reference in its entirety.

BACKGROUND

The present disclosure relates to semiconductor devices and, more particularly, to magnetic memory devices including magnetic tunnel junctions.

Magnetic memory devices may operate as high-speed and/or low-voltage semiconductor memory devices that may be included in high-speed and/or low power consumption electronic devices. A magnetic memory device may include a magnetic tunnel junction (MTJ). The magnetic tunnel junction may include two magnetic layers and an insulating layer located between the two magnetic layers. A resistance value of the magnetic tunnel junction may be changed depending on magnetization directions of the two magnetic layers. For example, if the magnetization directions of the two magnetic layers are oriented anti-parallel to each other, the magnetic tunnel junction may have a relatively high resistance value. If the magnetization directions of the two magnetic layers are oriented parallel to each other, the magnetic tunnel junction may have a relatively low resistance value. The magnetic memory device may facilitate read and/or write operations based on a difference between the resistance values of the magnetic tunnel junction.

SUMMARY

In some example embodiments, a magnetic memory device may include a magnetic tunnel junction pattern on a substrate, a conductive line extending between the substrate and the magnetic tunnel junction pattern and in contact with a bottom surface of the magnetic tunnel junction pattern and having a first lattice constant, and a bottom pattern located between the conductive line and the substrate and in contact with a bottom surface of the conductive line and having a second lattice constant that is less than the first lattice constant of the first conductive line.

In some example embodiments, a magnetic memory device may include a magnetic tunnel junction pattern on a substrate, a conductive line extending between the substrate and the magnetic tunnel junction pattern and in contact with a bottom surface of the magnetic tunnel junction pattern, and a bottom pattern located between the conductive line and the substrate, wherein the bottom pattern is in contact with a bottom surface of the conductive line, wherein the bottom pattern has a nitrogen content that is higher than a metal element content of the bottom pattern.

Some example embodiments of some inventive concepts may provide magnetic memory devices wherein switching properties are improved due to improved efficiency of spin-orbit torque.

DETAILED DESCRIPTION

Figure 1:
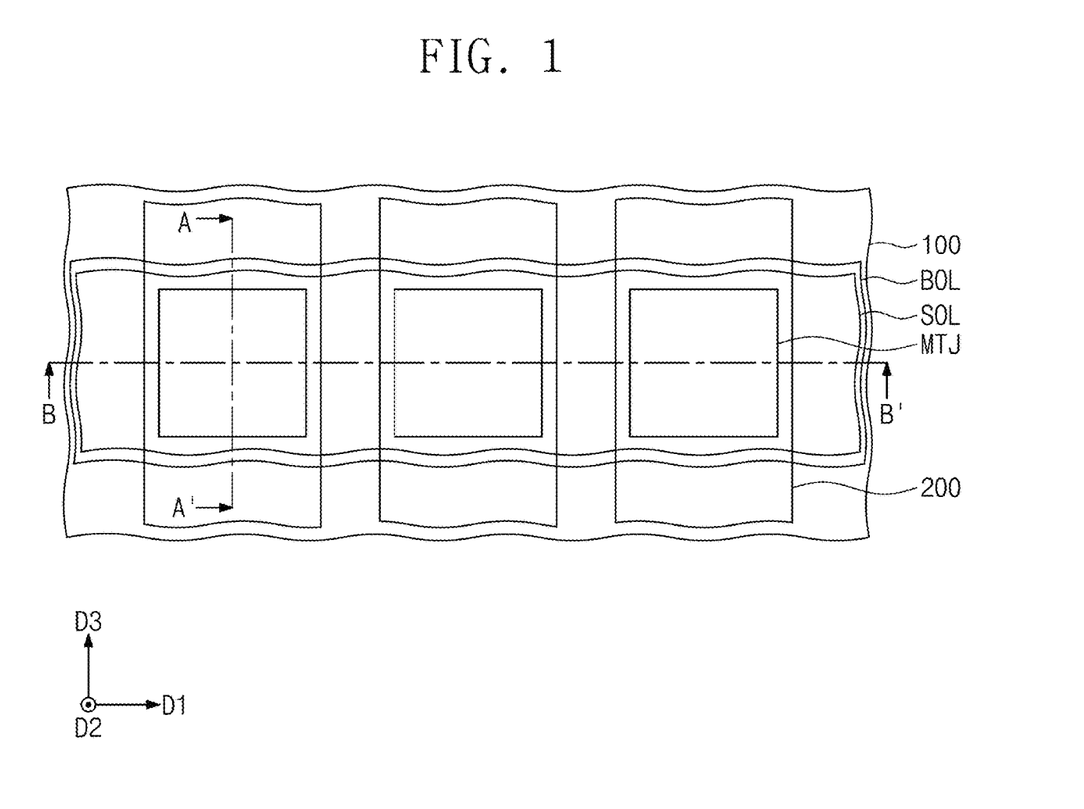
FIG. 1 is a plan view illustrating a magnetic memory device according to some example embodiments of some inventive concepts.
Figure 2:
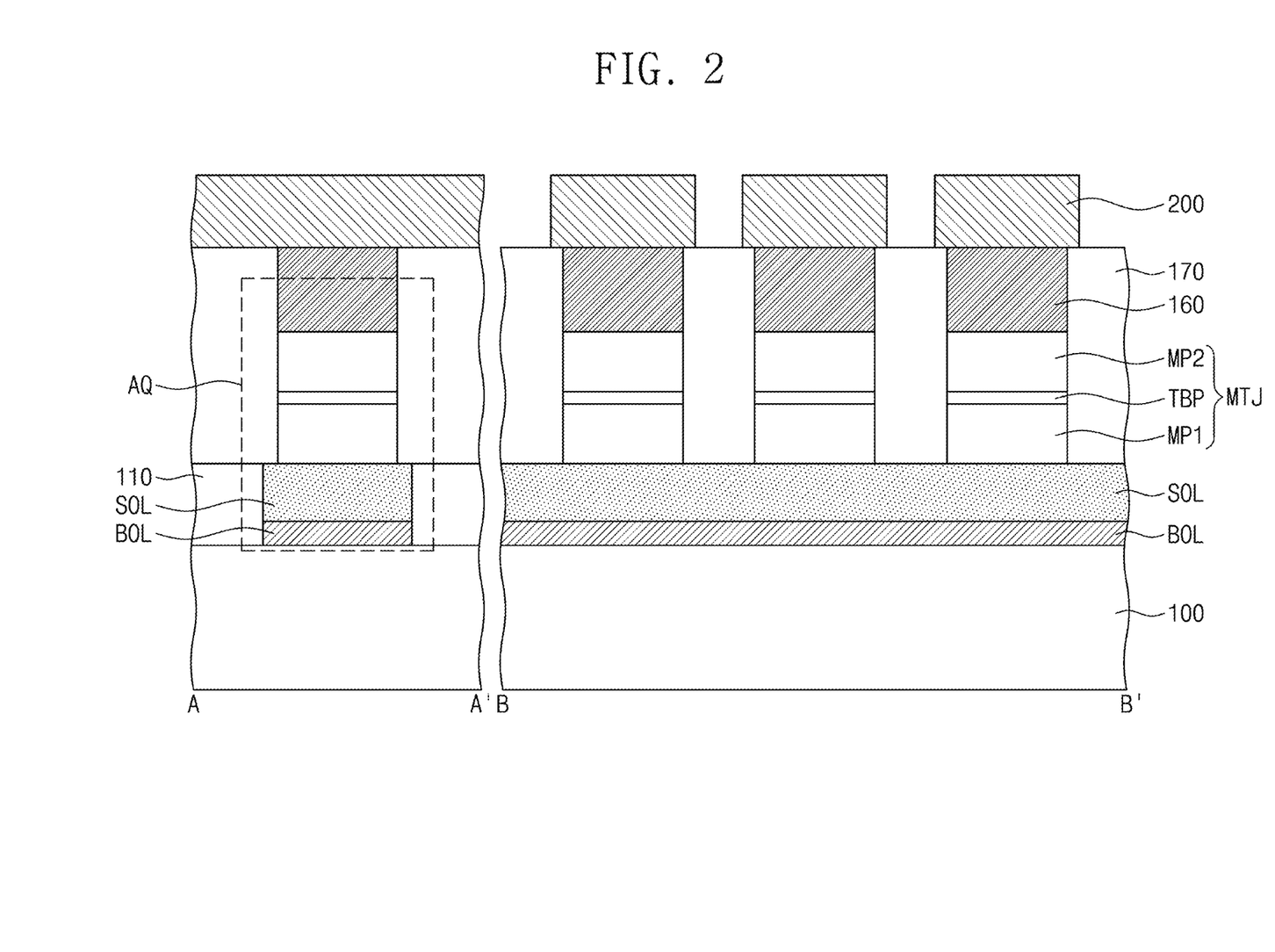
FIG. 2 is a cross-sectional view taken along either line A-A' or line B-B' of FIG. 1.
Figure 3:
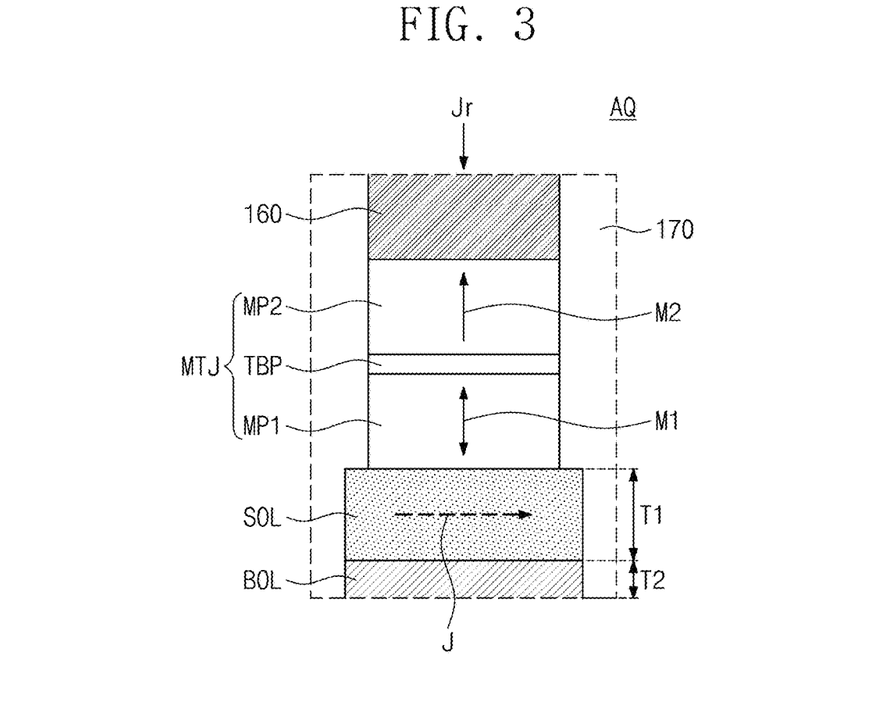
FIGS. 3 and 4 are enlarged views of a region 'AQ' of FIG. 2 according to some example embodiments of some inventive concepts.
Figure 4:
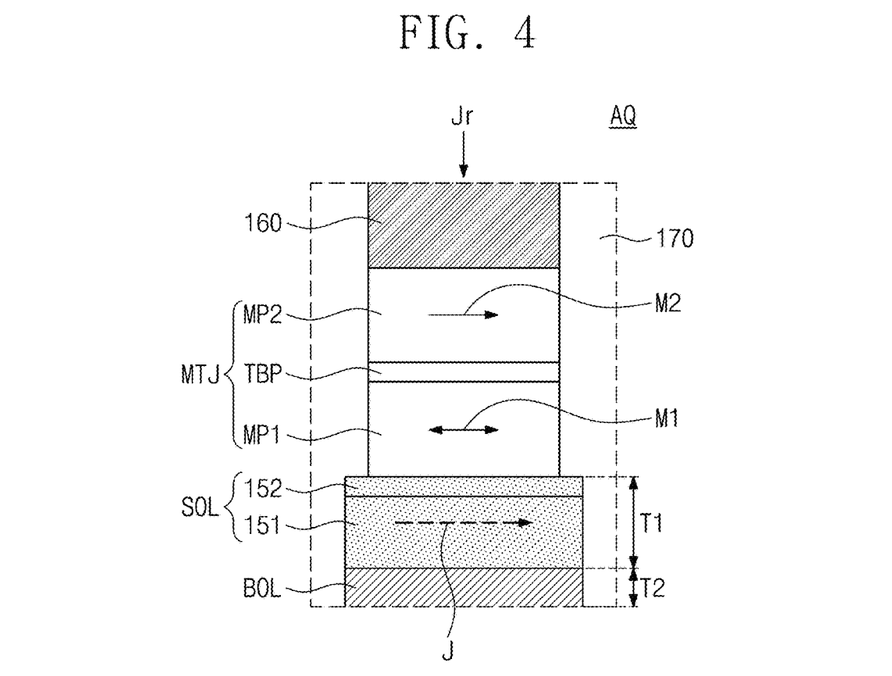

FIG. 1 is a plan view illustrating a magnetic memory device according to some example embodiments of some inventive concepts. FIG. 2 is a cross-sectional view taken along either line A-A' or line B-B' of FIG. 1. FIGS. 3 and 4 are enlarged views of a region 'AQ' of FIG. 2 according to some example embodiments of some inventive concepts.

Referring to FIGS. 1 to 3, magnetic tunnel junction patterns MTJ may be provided on a substrate 100. The substrate 100 may include a semiconductor substrate. For example, the semiconductor substrate may include silicon (Si), silicon on an insulator (SOI), silicon-germanium (SiGe), germanium (Ge), or gallium-arsenic (GaAs). The substrate 100 may include selection elements formed on the semiconductor substrate. The selection elements may be electrically connected to the magnetic tunnel junction patterns MTJ. The selection elements may be field effect transistors or diodes.

The magnetic tunnel junction patterns MTJ may be provided on the substrate 100, as described herein. For example, the magnetic tunnel junction patterns MTJ may be located in an upper interlayer insulating layer 170. The upper interlayer insulating layer 170 may cover sidewalls of the magnetic tunnel junction patterns MTJ. The upper interlayer insulating layer 170 may include at least one of an oxide, a nitride, or an oxynitride.

In some example embodiments, magnetic tunnel junction patterns MTJ may be two-dimensionally arranged on the substrate 100. For example, the magnetic tunnel junction patterns MTJ may be arranged in a first direction D1 and/or a third direction D3. The first direction D1 and the third direction D3 may represent axes that are oriented parallel to a top surface of the substrate 100 and may intersect each other, such as a latitudinal and/or longitudinal axis in a plan view of the substrate 100. As used herein, "height axis" means an axis that is oriented substantially perpendicular to a top surface of the substrate 100, such as second direction D2 in FIG. 1.

In some example embodiments, one or more magnetic tunnel junction patterns MTJ may include a set of layers that are sequentially stacked along a height axis, wherein the set of layers includes a first magnetic pattern MP1, a tunnel barrier pattern TBP, and/or a second magnetic pattern MP2. The tunnel barrier pattern TBP may be located between the first magnetic pattern MP1 and the second magnetic pattern MP2. For example, the tunnel barrier pattern TBP may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer. The first magnetic pattern MP1 and/or the second magnetic pattern MP2 may include at least one magnetic layer. The magnetic tunnel junction patterns MTJ may be understood with reference to FIGS. 3 and 4.

In some example embodiments, electrode patterns 160 may be located on the magnetic tunnel junction patterns MTJ, respectively. The first magnetic pattern MP1 may be located between the substrate 100 and the tunnel barrier pattern TBP, and/or the second magnetic pattern MP2 may be located between the tunnel barrier pattern TBP and each of the electrode patterns 160. For example, the electrode patterns 160 may include at least one of a metal (e.g., Ta, W, Ru, or Ir) or a conductive metal nitride (e.g., TiN).

In some example embodiments, upper conductive lines 200 may be located on the upper interlayer insulating layer 170. The upper conductive lines 200 may be connected to the magnetic tunnel junction patterns MTJ. Each of the upper conductive lines 200 may be electrically connected to a corresponding one of the magnetic tunnel junction patterns MTJ through a corresponding one of the electrode patterns 160. For example, the upper conductive lines 200 may extend in the third direction D3 and/or may be spaced apart from each other in the first direction D1. The upper conductive lines 200 may include at least one of a metal (e.g., copper) or a conductive metal nitride. The upper conductive lines 200 may function as bit lines.

In some example embodiments, a conductive line SOL may be located between the substrate 100 and the magnetic tunnel junction patterns MTJ. The conductive line SOL may be provided in plurality, where each of the plurality of conductive lines SOL may extend in the first direction D1 and/or may be connected to bottom surfaces of a plurality of the magnetic tunnel junction patterns MTJ. For example, top surfaces of the conductive lines SOL may be in contact with bottom surfaces of the first magnetic patterns MP1. The conductive lines SOL may be located in a lower interlayer insulating layer 110. The lower interlayer insulating layer 110 may include at least one of an oxide, a nitride, or an oxynitride. The conductive lines SOL may be insulated from each other by the lower interlayer insulating layer 110.

In some example embodiments, a bottom pattern BOL may be located between the conductive line SOL and the substrate 100. In some example embodiments, the bottom pattern BOL may be provided in plurality, where each of the bottom patterns BOL may be provided under the conductive lines SOL. For example, a set of bottom patterns BOL may be formed together with the conductive lines SOL (e.g., by the same patterning process), and/or sidewalls of the bottom patterns BOL may be aligned with sidewalls of the respective conductive lines SOL. In some example embodiments, the bottom pattern BOL may have a substantially similar planar shape as the conductive line SOL. However, some example embodiments of the inventive concepts are not limited thereto. For example, in some other example embodiments, a width and/or a length of the bottom pattern BOL may be different from a width and/or a length of a corresponding conductive line SOL viewed in a plan view.

The conductive line SOL and the bottom pattern BOL may be understood with reference to FIGS. 3 and 4. In some example embodiments, the conductive line SOL may be configured to apply spin-orbit torque to the magnetic tunnel junction patterns MTJ connected thereto. For example, a current J may flow through the conductive line SOL. The current J may be an in-plane current flowing through the conductive line SOL. The conductive line SOL may be configured to have strong spin-orbit interaction. The current J flowing through the conductive line SOL may cause accumulation of spin-polarized charge carriers (e.g., electrons) near the magnetic tunnel junction patterns MTJ by the spin-orbit interaction in the conductive line SOL. A spin-orbit field may be generated by the accumulated charge carriers. The spin-orbit field may be in a plane of the conductive line SOL and/or may be perpendicular to a direction of the in-plane current J flowing through the conductive line SOL. For example, the in-plane current J may flow in the first direction D1 in the conductive line SOL, and/or the spin-orbit field may be parallel to the third direction D3. The spin-orbit field generated in the conductive line SOL may apply the spin-orbit torque to the magnetic tunnel junction patterns MTJ. Each of the magnetic tunnel junction patterns MTJ may be configured such that a magnetization direction of a free layer in each of the magnetic tunnel junction patterns MTJ is switched using the spin-orbit torque.

In some example embodiments, the conductive line SOL may include a heavy metal or a material doped with a heavy metal. For example, the conductive line SOL may include at least one of 'A', or 'M' doped with 'B'. In some example embodiments, the 'A' may include yttrium (Y), zirconium (Zr), niobium (Nb), molybdenum (Mo), technetium (Tc), ruthenium (Ru), rhodium (Rh), palladium (Pd), cadmium (Cd), indium (In), antimony (Sb), tellurium (Te), hafnium (Hf), tantalum (Ta, including high-resistance amorphous β-Ta), tungsten (W), rhenium (Re), osmium (Os), iridium (Ir), platinum (Pt), gold (Au), mercury (Hg), thallium (Tl), lead (Pb), bismuth (Bi), polonium (Po), astatine (At), and/or any combination thereof. In some example embodiments, the 'B' may include at least one of vanadium (V), chromium (Cr), manganese (Mn), iron (Fe), cobalt (Co), nickel (Ni), phosphorus (P), sulfur (S), zinc (Zn), gallium (Ga), germanium (Ge), arsenic (As), selenium (Se), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), antimony (Sb), tellurium (Te), iodine (I), lutetium (Lu), hafnium (Hf), tantalum (Ta), tungsten (W), rhenium (Re), osmium (Os), iridium (Ir), platinum (Pt), gold (Au), mercury (Hg), thallium (Tl), lead (Pb), bismuth (Bi), polonium (Po), astatine (At), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), or ytterbium (Yb). In some example embodiments, the 'M' may include at least one of aluminum (Al), titanium (Ti), vanadium (V), chromium (Cr), manganese (Mn), copper (Cu), zinc (Zn), silver (Ag), hafnium (Hf), tantalum (Ta), tungsten (W), rhenium (Re), platinum (Pt), gold (Au), mercury (Hg), lead (Pb), silicon (Si), gallium (Ga), gallium-manganese (GaMn), or gallium-arsenic (GaAs). For example, the conductive line SOL may include copper (Cu) doped with iridium (Ir), and/or copper (Cu) doped with bismuth (Bi).

Referring to FIG. 4, according to some example embodiments, the conductive line SOL may include a first conductive pattern 151 and a second conductive pattern 152 on the first conductive pattern 151. For example, the first conductive pattern 151 may be a magnetic layer, and the second conductive pattern 152 may be a non-magnetic layer.

In some example embodiments, a portion of the in-plane current J flowing through the conductive line SOL may be spin-polarized by the first conductive pattern 151. For example, charge carriers (e.g., electrons) in the first conductive pattern 151 may be spin-polarized along a direction of a magnetic moment of the first conductive pattern 151. The spin-polarized charge carriers may flow from the first conductive pattern 151 into the second conductive pattern 152 and/or may accumulate in the second conductive pattern 152 near to the magnetic tunnel junction patterns MTJ. The spin-orbit torque may be applied to the magnetic tunnel junction patterns MTJ by the accumulation of the spin-polarized charge carriers. Each of the magnetic tunnel junction patterns MTJ may be configured such that the magnetization direction of the free layer in each of the magnetic tunnel junction patterns MTJ is switched using the spin-orbit torque.

In some example embodiments, a first conductive pattern 151 may include at least one of iron (Fe), cobalt (Co), or nickel (Ni) and/or may include at least one of platinum (Pt), palladium (Pd), manganese (Mn), yttrium (Y), chromium (Cr), ruthenium (Ru), rhodium (Rh), tungsten (W), tantalum (Ta), boron (B), bismuth (Bi), iridium (Ir), lead (Pb), nitrogen (N), or oxygen (O). The second conductive pattern 152 may include at least one of copper (Cu), silver (Ag), gold (Au), tantalum (Ta), tungsten (W), or nitrogen (N). The materials of the first conductive pattern 151 and the second conductive pattern 152 are not limited to the materials described herein.

In some example embodiments, a top surface of the bottom pattern BOL may be in contact with a bottom surface of the conductive line SOL. In some example embodiments, the bottom pattern BOL may provide compressive stress to the conductive line SOL. For example, a material of a conductive line SOL may have a first lattice constant, and a material of a bottom pattern BOL may have a second lattice constant that is less than the first lattice constant of the material of the conductive line SOL. In other words, the conductive line SOL may be formed with a first lattice constant that is reduced relative to an intrinsic lattice constant of the material of the conductive line SOL.

A grain density may be defined as the number of grains per unit area. A grain size of the conductive line SOL may be reduced by the bottom pattern BOL, as compared with an alternative semiconductor device in which the bottom pattern BOL does not exist. In other words, the bottom pattern BOL may increase a grain density of the conductive line SOL. Structures that exhibit an increased grain density of the conductive line SOL may also exhibit an increased resistivity of the conductive line SOL.

In some example embodiments, a grain density of a top surface of a bottom pattern BOL may be equal to a grain density of a bottom surface of the bottom pattern BOL. In some other example embodiments, a grain density of a top surface of a bottom pattern BOL may be greater than a grain density of a bottom surface of the bottom pattern BOL.

In some example embodiments, a grain density of a top surface of a conductive line SOL may be equal to a grain density of a bottom surface of the conductive line SOL. In some other example embodiments, a grain density of a top surface of a conductive line SOL may differ from a grain density of a bottom surface of the conductive line SOL.

In some example embodiments, a grain density of a bottom surface of a conductive line SOL in contact with the bottom pattern BOL may be greater than a grain density of the top surface of the conductive line SOL. For example, a grain density of the conductive line SOL may become progressively less from the bottom surface to the top surface thereof. That is, the grain density at a vertical location within the conductive line SOL may be inversely proportional to the distance between the vertical location and the bottom surface of the conductive line SOL that is in contact with the bottom pattern BOL.

In some example embodiments, the reduction in lattice constant of the conductive line SOL and/or the change in grain size of the conductive line SOL may increase the efficiency of spin-orbit torque applied to the magnetic tunnel junction pattern(s) MTJ by the conductive line SOL. In some example embodiments, such spin-orbit torque may be increased even though the same current J flows through the conductive line SOL, which may improve the switching efficiency of a memory element such as a magnetic tunnel junction pattern MTJ.

In some example embodiments, a thickness T2 of the bottom pattern BOL along a height axis may be less than a thickness T1 of the conductive line SOL along the height axis. For example, the thickness T1 of the conductive line SOL along the height axis may range from about 2 times to about 5 times the thickness T2 of the bottom pattern BOL along the height axis. For example, the thickness T1 of the conductive line SOL along the height axis may range from about 300 Å to about 700 Å. For example, the thickness T2 of the bottom pattern BOL along a height axis may range from about 80 Å to about 300 Å. However, in some other example embodiments, a thickness T1 of the conductive line SOL along a height axis may be similar to or less than a thickness T2 of the bottom pattern BOL along the height axis.

In some example embodiments, the bottom pattern BOL may be a non-magnetic layer. For example, the bottom pattern BOL may be formed of a material of which a resistivity is greater than that of the conductive line SOL. Thus, current flowing under the magnetic tunnel junction patterns MTJ may selectively flow through the conductive line SOL. As a result, the bottom pattern BOL may not affect (e.g., reduce) the spin-orbit torque generated by the conductive line SOL.

In some example embodiments, the bottom pattern BOL may include a metal nitride such as TiN, TaN, or WN. In some example embodiments in which the bottom pattern BOL is formed of the metal nitride, the bottom pattern BOL may be formed of a nitrogen-rich metal nitride in which a nitrogen content is higher than a metal element content. As used herein, "content" may be measured as, for example, atomic percent, atomic density, molar concentration, number concentration, and/or volume concentration, as well as other measurements that may be understood by a person of ordinary skill in the art. In some example embodiments, a ratio of nitrogen content in the bottom pattern BOL to the metal element content in the bottom pattern BOL may be substantially between from 1.0 and 1.3. The nitrogen-rich metal nitride may be formed, for example, by adjusting a source supply time and/or a cycle of a deposition process. In some example embodiments, compressive stress may be generated in the bottom pattern BOL formed of the nitrogen-rich metal nitride, as compared with a metal-rich metal nitride. In some example embodiments, compressive stress may be provided in the conductive line SOL in the formation of the conductive line SOL by the compressive stress in the bottom pattern BOL. Thus, the grain density of the conductive line SOL may be increased.

Referring again to FIGS. 3 and 4, the first magnetic pattern MP1 may be located between the conductive line SOL and the tunnel barrier pattern TBP, and/or the second magnetic pattern MP2 may be located between each of the electrode patterns 160 and the tunnel barrier pattern TBP. The second magnetic pattern MP2 may be utilized and/or configured to operate as a reference layer having a magnetization direction M2 fixed in one direction, and the first magnetic pattern MP1 may be utilized and/or configured to operate as a free layer having a magnetization direction M1 changeable to be parallel or anti-parallel to the magnetization direction M2 of the reference layer. FIGS. 3 and 4 illustrate some example embodiments in which the first magnetic pattern MP1 may be utilized and/or configured to operate as the free layer and the second magnetic pattern MP2 may be utilized as the reference layer. However, some example embodiments of the inventive concepts are not limited thereto. For example, in some other example embodiments and unlike FIGS. 3 and 4, a first magnetic pattern MP1 may be utilized and/or configured to operate as a reference layer and a second magnetic pattern MP2 may be utilized and/or configured to operate as a free layer.

In some example embodiments, as illustrated in FIG. 3, the magnetization directions M1 and M2 may be oriented along a height axis to form a perpendicular magnetic structure, and/or may form an interface between the tunnel barrier pattern TBP and the first magnetic pattern MP1. The reference layer and/or the free layer may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, and/or a perpendicular magnetic structure. The perpendicular magnetic material having the $L1_0$ structure may include (without limitation) one or more of: FePt having the $L1_0$ structure, FePd having the $L1_0$ structure, CoPd having the $L1_0$ structure, and/or CoPt having the $L1_0$ structure. The perpendicular magnetic structure may include magnetic layers and non-magnetic layers, which may be alternately and repeatedly stacked in a height axis. For example, the perpendicular magnetic structure may include (without limitation) one or more of: (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n, where "n" denotes the number of bilayers.

In some example embodiments, a thickness of reference layer along a height axis may be larger than a thickness of the free layer along a height axis. In some other example embodiments, a thickness of reference layer along a height axis may be similar to or smaller than a thickness of the free layer along a height axis.

In some example embodiments, a coercive force of a reference layer may be greater than a coercive force of a free layer. In some other example embodiments, a coercive force of a reference layer may be similar to or less than a coercive force of a free layer.

In some example embodiments, such as those illustrated in FIG. 4, the magnetization directions M1 and M2 may be substantially parallel to the interface between the tunnel barrier pattern TBP and the first magnetic pattern MP1. For example, the reference layer and/or the free layer may include a ferromagnetic material. In some example embodiments, a reference layer may further include an anti-ferromagnetic material for fixing or pinning a magnetization direction of the ferromagnetic material. However, some example embodiments are not limited to such magnetization directions M1 and M2 and/or the structures described in FIGS. 3 and 4. For example, in some other example embodiments, the magnetization directions M1 and M2 of FIG. 3 may be exchanged with the magnetization directions M1 and M2 of FIG. 4.

As described with reference to FIGS. 2, 3 and 4, the conductive line SOL may be configured to apply the spin-orbit torque to the magnetic tunnel junction patterns MTJ. The magnetization direction of the free layer in each of the magnetic tunnel junction patterns MTJ may be switched using the spin-orbit torque. According to some example embodiments of some inventive concepts, a switching operation (e.g., a write operation) of the magnetic tunnel junction patterns MTJ may be performed based on the spin-orbit torque. A read operation of the magnetic tunnel junction patterns MTJ may be performed by a similar method to those of spin-transfer torque memories. For example, a read current Jr may flow in a direction perpendicular to surfaces (or planes) of the magnetic tunnel junction patterns MTJ through the upper conductive lines 200 of FIGS. 3 and 4. Resistance states of the magnetic tunnel junction patterns MTJ may be detected by the read current Jr. For example, whether the magnetic tunnel junction pattern MTJ is in a high-resistance state or a low-resistance state may be detected by the read current Jr.

According to some embodiments of some inventive concepts, the efficiency of the spin-orbit torque applied to the magnetic tunnel junction patterns by the conductive line may be increased by the bottom pattern. Thus, switching efficiency of a memory element (e.g., a magnetic tunnel junction pattern MTJ) may be improved.

FIGS. 5 to 8 are enlarged views of the region 'AQ' of FIG. 2 to illustrate bottom patterns according to some example embodiments of some inventive concepts.

Figure 5:
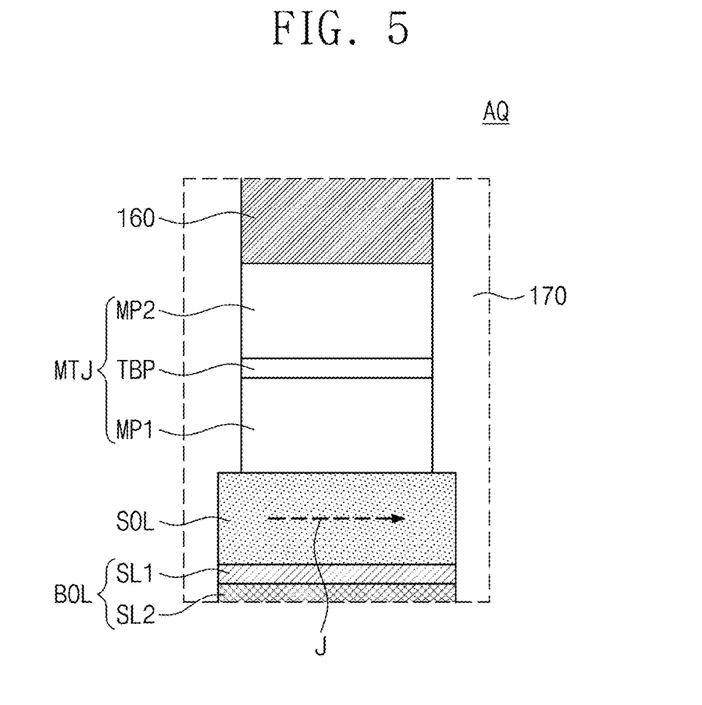
FIGS. 5 to 8 are enlarged views of the region 'AQ' of FIG. 2 to illustrate bottom patterns according to some example embodiments of some inventive concepts.
Figure 6:
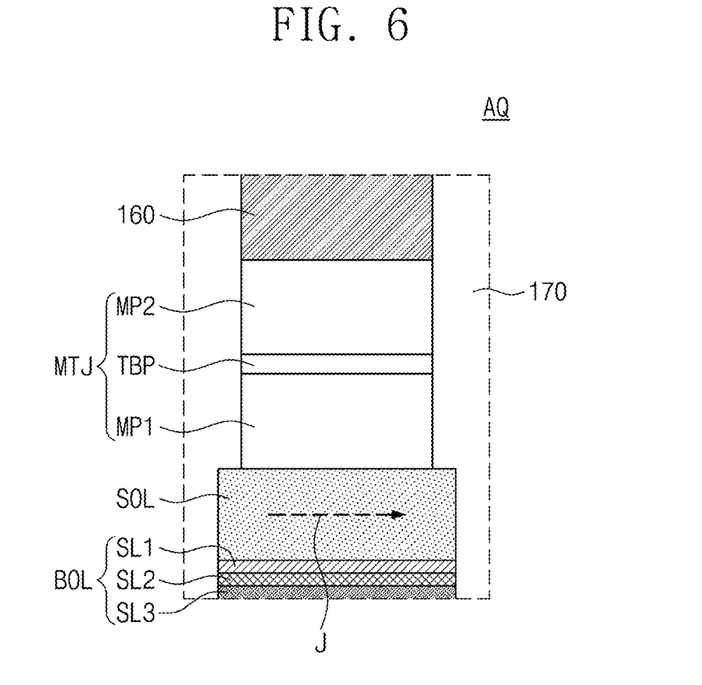

As illustrated in FIGS. 5 and 6, the bottom pattern BOL may consist of a plurality of layers. In some example embodiments, the bottom pattern BOL may include a first bottom pattern SL1 and a second bottom pattern SL2 under the first bottom pattern SL1, as illustrated in FIG. 5. The first bottom pattern SL1 may be a metal nitride layer, and/or the second bottom pattern SL2 may be a metal layer. For example, the first bottom pattern SL1 may be a TiN layer, a TaN layer, or a WN layer, and/or the second bottom pattern SL2 may be a Ti layer, a Ta layer, or a W layer. Alternatively, the second bottom pattern SL2 may be a silicon nitride layer.

In some example embodiments, a first bottom pattern SL1 may be thicker along a height axis than a second bottom pattern SL2 along the height axis. For example, a thickness of the first bottom pattern SL1 along a height axis may range from about 1.5 times to about 5 times a thickness of the second bottom pattern SL2 along the height axis. For example, the thickness of the first bottom pattern SL1 along a height axis may range from about 80 Å to about 150 Å, and/or the thickness of the second bottom pattern SL2 along a height axis may range from about 30 Å to about 80 Å. Alternatively, if the second bottom pattern SL2 is the silicon nitride layer, a thickness of the second bottom pattern SL2 may be about 2 times to about 5 times thicker along a height axis than a thickness of the first bottom pattern SL1 along the height axis.

In some example embodiments, the bottom pattern BOL may include a first bottom pattern SL1, such as the first bottom pattern SL1 illustrated in FIG. 5. In some example embodiments, the bottom pattern BOL may include a second bottom pattern SL2 under the first bottom pattern SL1, which may be a metal layer such as a Ti layer, a Ta layer, and/or a W layer. In some example embodiments, the bottom pattern BOL may include a third bottom pattern SL3 under the second bottom pattern SL2, such as illustrated in FIG. 6. For example, the third bottom pattern SL3 may be a layer used as an etch stop layer in a manufacturing method to be described later with reference to FIGS. 9 to 14. For example, the third bottom pattern SL3 may include a silicon nitride-based material such as SiN, SiON, SiCN, and/or SiOCN.

In some example embodiments, a thickness of the first bottom pattern SL1 along a height axis may be greater than a thickness of the second bottom pattern SL2 along the height axis. In some other example embodiments, the thickness of a first bottom pattern SL1 along a height axis may be substantially similar to the thickness of the second bottom pattern SL2 along the height axis.

In some example embodiments, a thickness of a third bottom pattern SL3 along a height axis may be greater than a thickness of a first bottom pattern SL1 and/or a second bottom pattern SL2 along the height axis. In some other example embodiments, a thickness of a third bottom layer SL3 along a height axis may be substantially similar to a thickness of the first bottom pattern SL1 and/or the second bottom pattern SL2 along the height axis.

Figure 7:
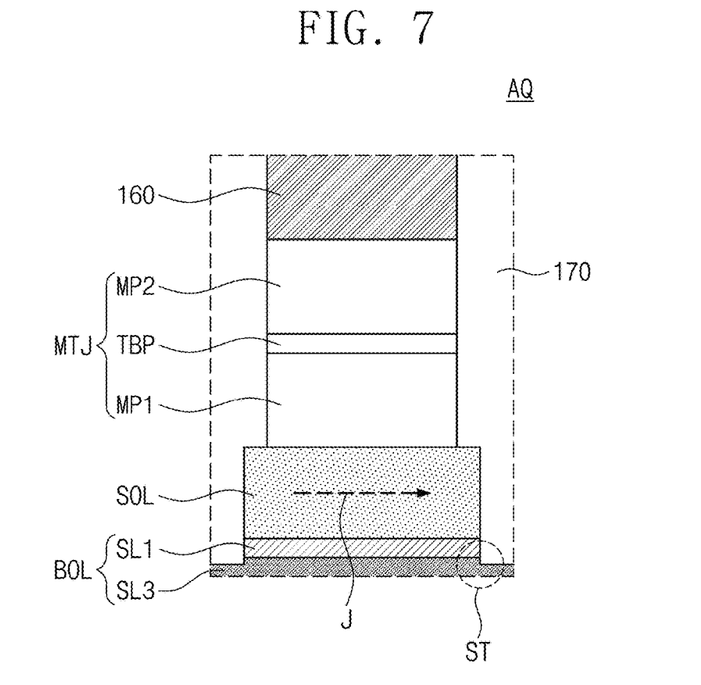
Figure 8:
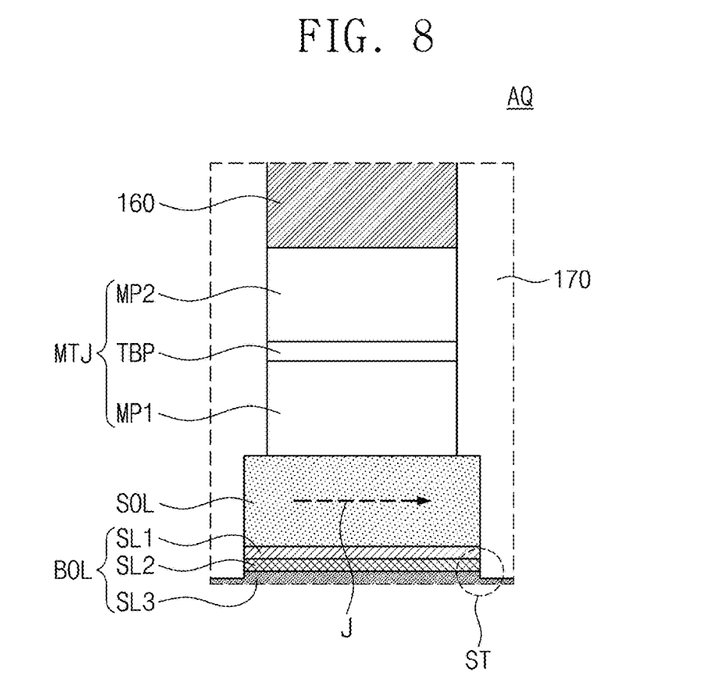

In some example embodiments, including those illustrated in FIGS. 5 and 6, a semiconductor device may include a bottom pattern BOL with sidewalls (e.g., sidewalls of the first, second, and/or third bottom patterns SL1, SL2 and SL3) that may be substantially aligned with one or more corresponding sidewalls of a conductive line SOL along a height axis. For example, and as illustrated in FIGS. 7 and 8, a semiconductor device may include a bottom pattern BOL with a stepped shape, such as a stepped structure ST that extends beyond and/or protrudes relative to a sidewall of the conductive line SOL along a lateral axis. For example, the stepped structure ST may be a remaining shape of the second bottom pattern SL2 and/or a third bottom pattern SL3 after the second bottom pattern SL2 and/or the third bottom pattern SL3 are used as an etch stop layer. In some example embodiments, the second bottom pattern SL2 or the third bottom pattern SL3 may extend along a lateral axis (e.g., in direction D1) relative to the substrate 100 between the magnetic tunnel junction patterns MTJ that are adjacent to each other in the third direction D3. In other words, in some example embodiments, a stepped structure ST of the second bottom pattern SL2 and/or the third bottom pattern SL3 may have a plate shape and/or may cover the substrate 100 along a lateral axis (e.g., in direction D1) between the magnetic tunnel junction patterns MTJ two-dimensionally arranged along another lateral axis (e.g., direction D3). In some example embodiments, a stepped structure ST of a second bottom pattern SL2 and/or a third bottom pattern SL3 may extend onto the substrate 100 along a lateral axis (e.g., in direction D1) between the conductive lines SOL. In some example embodiments, a sidewall of a bottom pattern BOL may not be substantially aligned with a sidewall of a conductive line SOL along a height axis.

Figure 9:
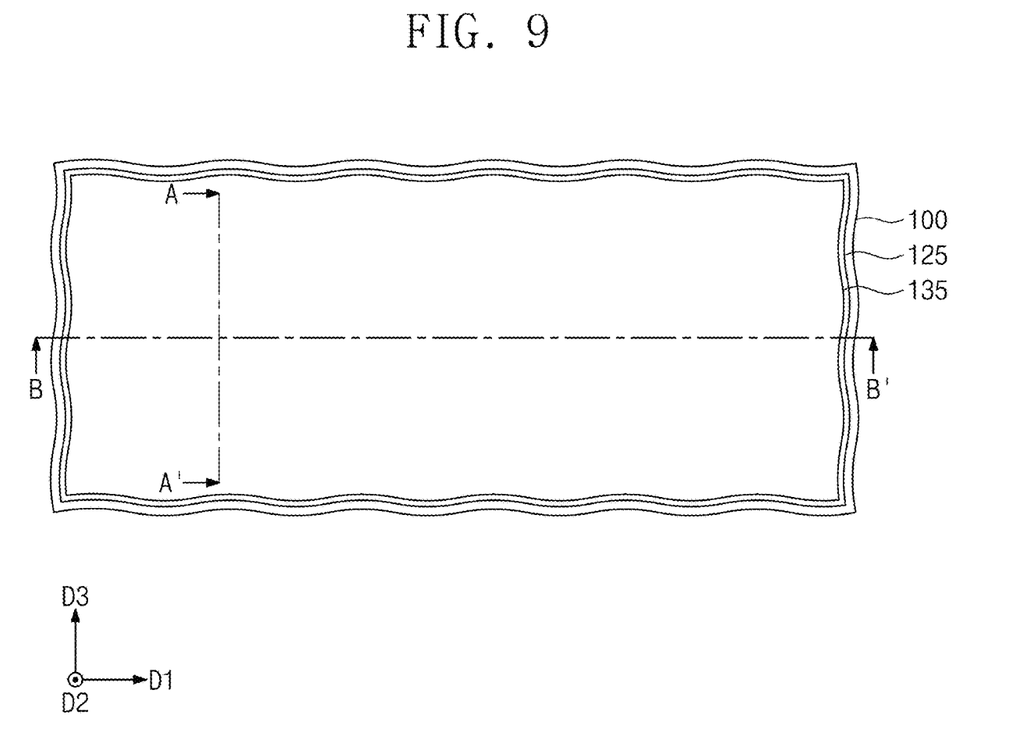
FIGS. 9, 11 and 13 are plan views illustrating a method of manufacturing a magnetic memory device, according to some example embodiments of some inventive concepts.
Figure 10:
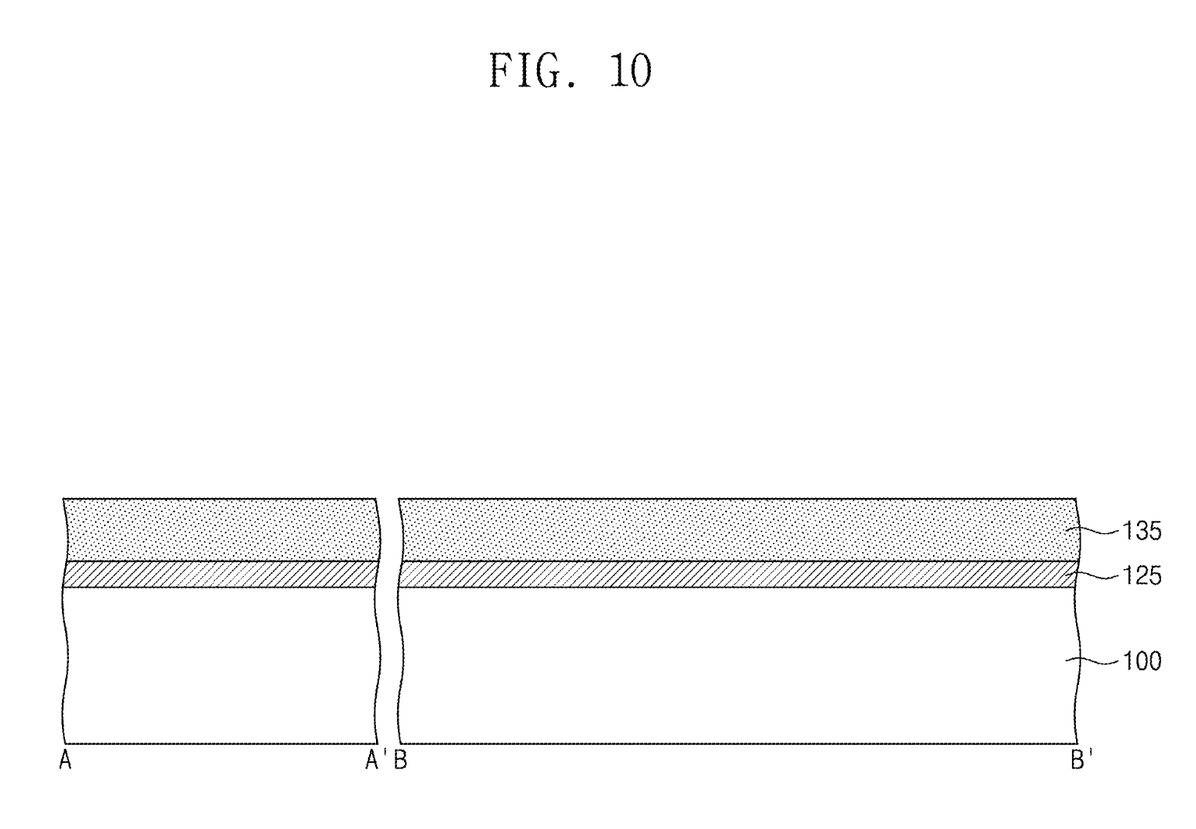
FIGS. 10, 12 and 14 are cross-sectional views taken along either line A-A' or line B-B' of FIGS. 9, 11 and 13, respectively, according to some example embodiments of some inventive concepts.
Figure 11:
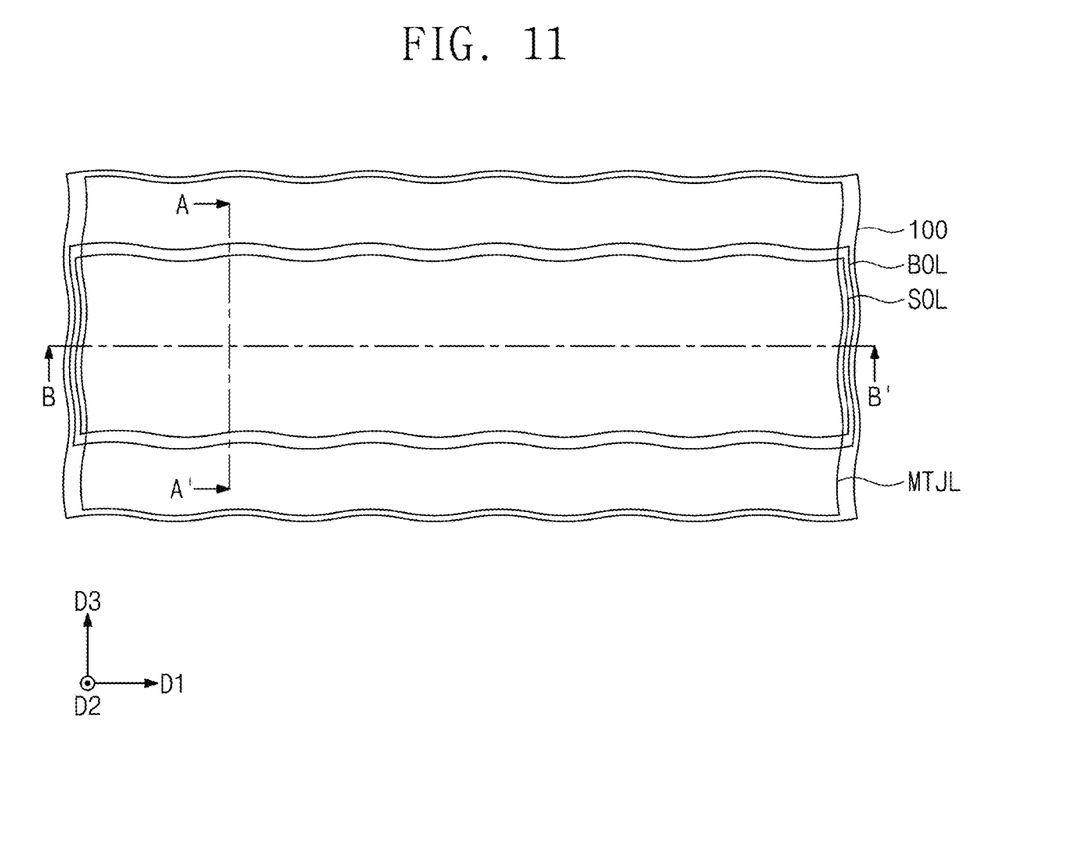
Figure 12:
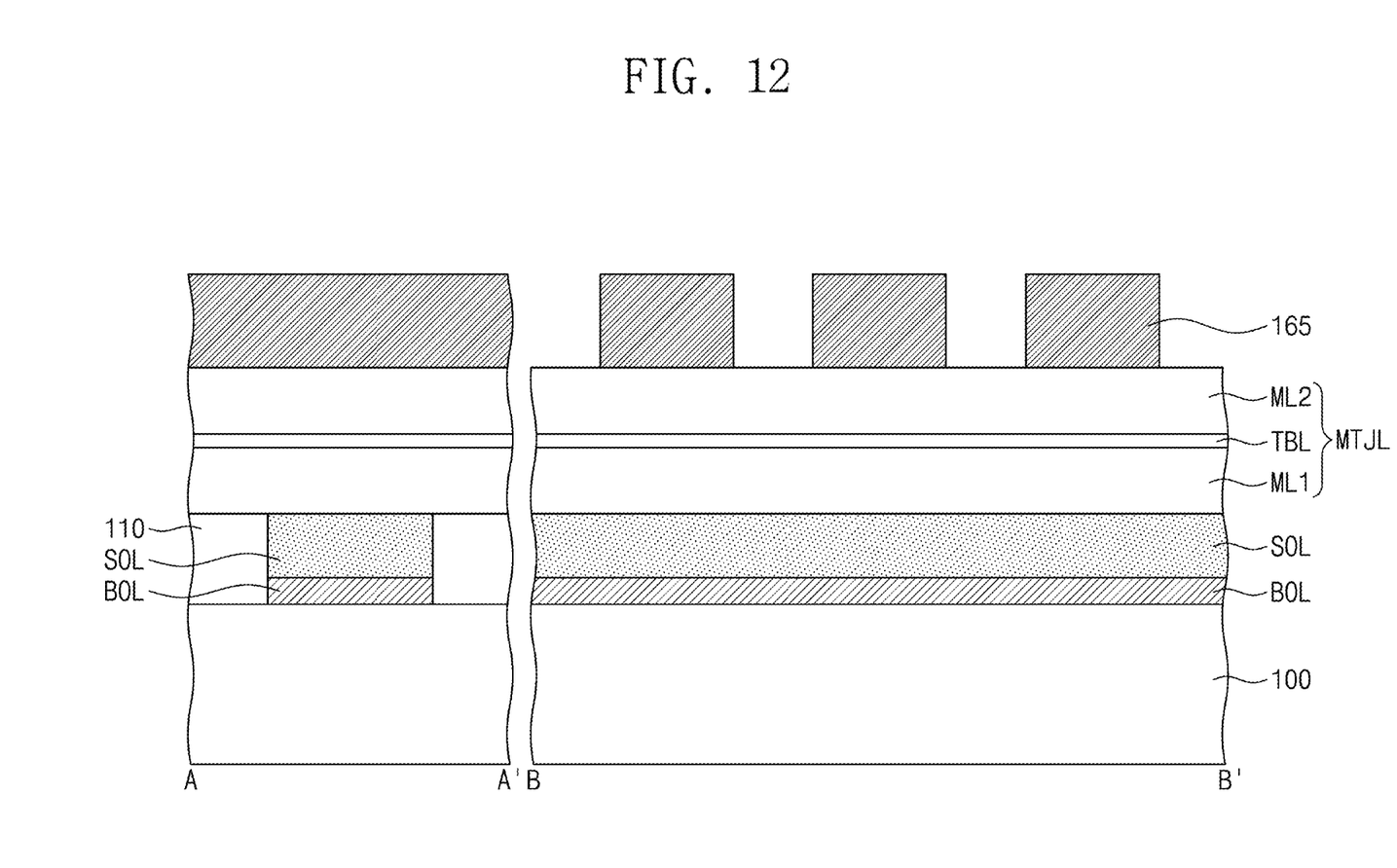
Figure 13:
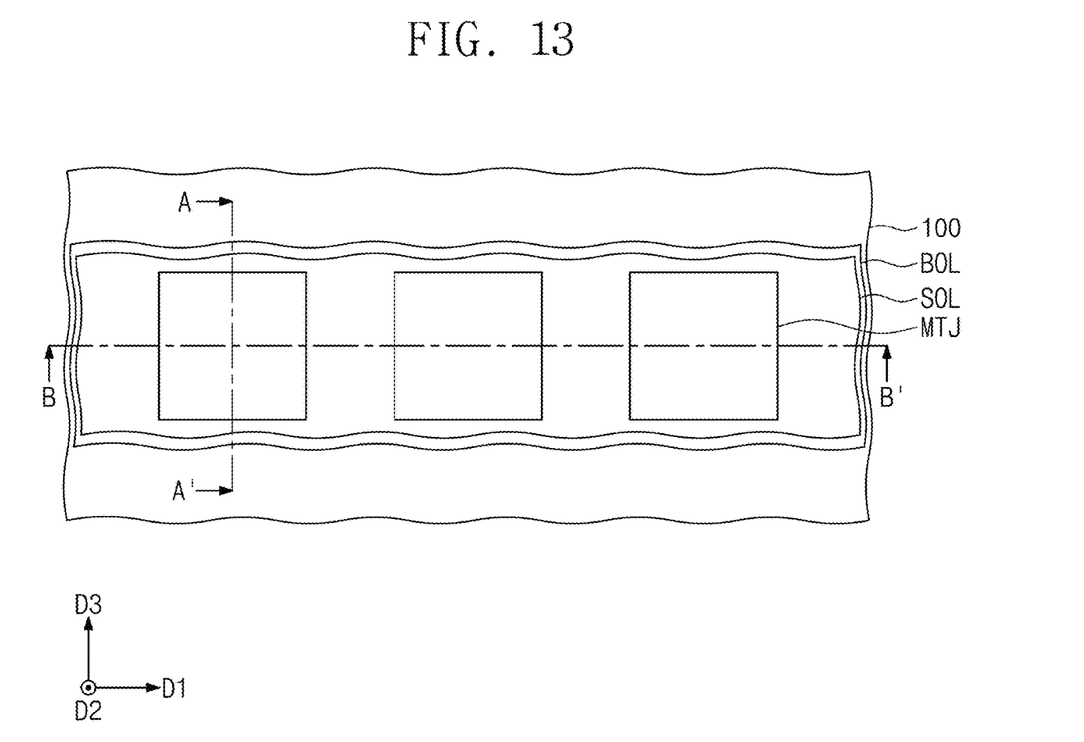
Figure 14:
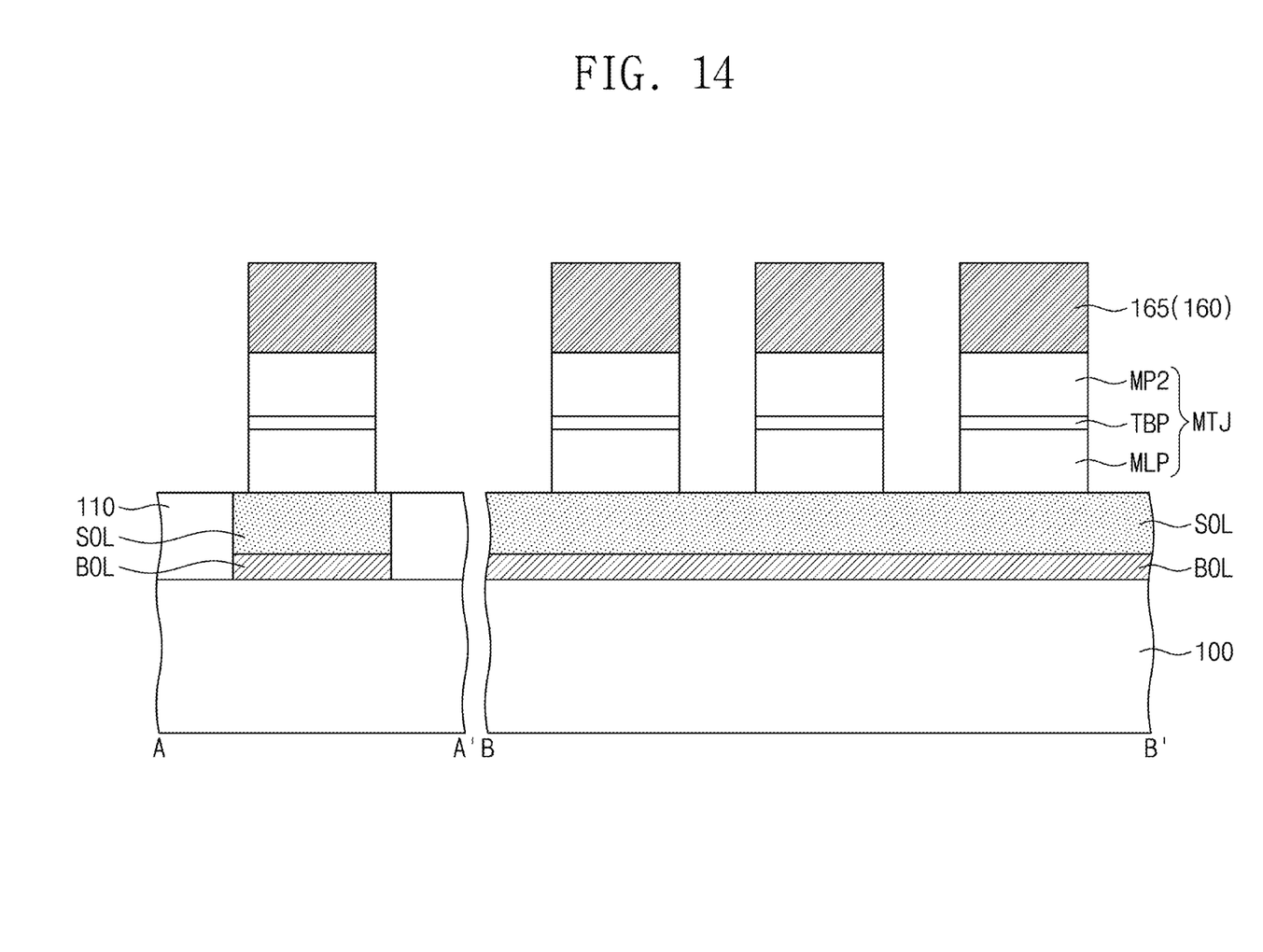

FIGS. 9, 11 and 13 are plan views illustrating example methods of manufacturing magnetic memory devices according to some example embodiments of some inventive concepts. FIGS. 10, 12 and 14 are cross-sectional views taken along either line A-A' or line B-B' of FIGS. 9, 11 and 13, respectively. Hereinafter, some portions of the descriptions of similar features presented in FIGS. 1 to 8 are omitted for ease and convenience in explanation.

In some example embodiments including those illustrated in FIGS. 9 and 10, a bottom layer 125 and a conductive layer 135 may be sequentially formed on a substrate 100. For example, the substrate 100 may include a semiconductor substrate and selection elements formed on the semiconductor substrate. In some example embodiments, the bottom layer 125 and/or the conductive layer 135 may be formed by various manufacturing processes, including (without limitation) a sputtering process, a chemical vapor deposition (CVD) process, and/or an atomic layer deposition (ALD) process. In some example embodiments, materials and thicknesses of the bottom layer 125 and/or the conductive layer 135 may be similar to those of the bottom pattern BOL and/or the conductive line SOL described with reference to FIGS. 1 to 8. In some example embodiments, a thickness of a bottom layer 125 along a height axis may be greater than a thickness of a conductive layer 135 along the height axis. In some other example embodiments, a thickness of a bottom layer 125 along a height axis may be similar to a thickness of a conductive layer 135 along the height axis. In some example embodiments, a bottom layer 125 may provide a compressive stress in a conductive layer 135 during the formation of the conductive layer 135.

In some example embodiments, including those illustrated in FIGS. 11 and 12, a bottom layer 125 and a conductive layer 135 may be patterned to form a bottom pattern BOL and a conductive line SOL, respectively. For example, a patterning process of a bottom layer 125 and/or a conductive layer 135 may include forming a mask pattern on the conductive layer 135 and/or performing a dry and/or wet etching process using the mask pattern as an etch mask. As a result of an etching process, a sidewall of the bottom pattern BOL may be aligned, relative to a height axis, with a sidewall of the conductive line SOL. In some example embodiments, including those illustrated in FIGS. 7 and 8, a portion of the bottom pattern BOL may be used as an etch stop layer, and/or a stepped structure may be formed at the sidewall of the bottom pattern BOL. In some other example embodiments, a sidewall of a bottom pattern BOL may not be aligned, relative to a height axis, with a sidewall of a conductive line SOL.

In some example embodiments, a lower interlayer insulating layer 110 may be formed to cover the conductive line SOL relative to a lateral axis. A planarization process may be performed on the lower interlayer insulating layer 110 to expose a top surface of the conductive line SOL; that is, following planarization, the lower interlayer insulating layer 110 may not cover at least a portion of the top surface of the conductive line SOL. A magnetic tunnel junction layer MTJL may be formed to cover the conductive line SOL relative to a lateral axis. The magnetic tunnel junction layer MTJL may include a first magnetic layer ML1, a tunnel barrier layer TBL, and a second magnetic layer ML2, which are sequentially stacked along a height axis. Each of the first and second magnetic layers ML1 and ML2 may include at least one magnetic layer. The tunnel barrier layer TBL may include, without limitation, one or more of: a magnesium oxide (MgO) layer, a titanium oxide (TiO) layer, an aluminum oxide (AlO) layer, a magnesium-zinc oxide (MgZnO) layer, and/or a magnesium-boron oxide (MgBO) layer. In some example embodiments, the first magnetic layer ML1, the tunnel barrier layer TBL, and/or the second magnetic layer ML2 may be formed by a sputtering process or a CVD process. However, those of ordinary skill in the art may identify many manufacturing processes that may be used to form the first magnetic layer ML1, the tunnel barrier layer TBL, and/or the second magnetic layer ML2.

Conductive mask patterns 165 may be formed on the magnetic tunnel junction layer MTJL, where the conductive mask patterns 165 may define regions in which magnetic tunnel junction patterns are to be formed. In some example embodiments, the conductive mask patterns 165 may include (without limitation) one or more metals (e.g., Ta, W, Ru, or Ir) and/or one or more conductive metal nitrides (e.g., TiN).

In some example embodiments, including those shown in FIGS. 13 and 14, a magnetic tunnel junction layer MTJL may be etched to form magnetic tunnel junction patterns MTJ, where each magnetic tunnel junction patterns MTJ may include a first magnetic pattern MP1, a tunnel barrier pattern TBP, and a second magnetic pattern MP2, which may be sequentially stacked on the conductive line SOL along a height axis. In some example embodiments, the first magnetic pattern MP1 and the second magnetic pattern MP2 may be spaced apart from each other along a lateral axis, with the tunnel barrier pattern TBP interposed therebetween. That is, some example embodiments may include a first conductive line and a second conductive line, and a lowermost layer of the bottom pattern may extend onto the substrate between the first conductive line and the second conductive line.

In some example embodiments, a magnetic tunnel junction layer MTJL may be etched by, for example, an ion beam etching process, which may involve irradiating an ion beam onto the substrate 100, where the ion beam may include inert ions (e.g., argon positive ions (Ar$^+$)). For example, the ion beam may be irradiated obliquely with respect to a top surface of the substrate 100. In some example embodiments, during the ion beam etching process, the substrate 100 may rotate using a height axis as a rotation axis. A portion of the top surface of the conductive line SOL may be recessed toward the substrate 100 by the ion beam etching process. In some example embodiments, an ion beam etching process may use the conductive mask patterns 165 as etch masks, such that one or more residual portions of the conductive mask patterns 165 may remain on and form one or more magnetic tunnel junction patterns MTJ, respectively. The residual portions of the conductive mask patterns 165 may function as electrode patterns 160.

In some example embodiments, including those illustrated in FIGS. 1 and 2, an upper interlayer insulating layer 170 may be formed on a lower interlayer insulating layer 110 relative to a height axis, and/or may cover at least a portion of a magnetic tunnel junction patterns MTJ and the electrode patterns 160 relative to the height axis. In some example embodiments, an upper interlayer insulating layer 170 may cover at least a portion of at least one sidewall of a magnetic tunnel junction pattern MTJ and/or an electrode pattern 160. In some example embodiments, upper conductive lines 200 may be formed on the upper interlayer insulating layer 170 relative to a height axis. Each of the upper conductive lines 200 may be electrically connected to a corresponding one of the magnetic tunnel junction patterns MTJ through a corresponding one of the electrode patterns 160.

While some inventive concepts have been described with reference to some example embodiments, those skilled in the art may understand that various changes and modifications may be made without departing from the spirit and scope of some inventive concepts included in some example embodiments. The example embodiments presented herein are not intended to be limiting, but rather illustrative. Thus, the range, variety, and/or scope of example embodiments covered by the present application is to be determined by the broadest permissible interpretation of the following claims and their equivalents, and shall not be restricted or limited by the foregoing description.

What is claimed is:

1. A magnetic memory device comprising:
   a magnetic tunnel junction pattern on a substrate;
   a conductive line extending between the substrate and the magnetic tunnel junction pattern and in contact with a bottom surface of the magnetic tunnel junction pattern, wherein the conductive line has a first lattice constant; and
   a bottom pattern located between the conductive line and the substrate and in contact with a bottom surface of the conductive line, wherein the bottom pattern has a second lattice constant that is less than the first lattice constant of the conductive line.

2. The magnetic memory device of claim 1, wherein sidewalls of the bottom pattern are aligned with sidewalls of the conductive line relative to a height axis.

3. The magnetic memory device of claim 1, wherein a thickness of the bottom pattern along a height axis is less than a thickness of the conductive line along the height axis.

4. The magnetic memory device of claim 3, wherein the thickness of the conductive line along the height axis is at least twice the thickness of the bottom pattern along the height axis.

5. The magnetic memory device of claim 1, wherein a resistivity of the bottom pattern is greater than a resistivity of the conductive line.

6. The magnetic memory device of claim 1, wherein the bottom pattern includes a metal nitride.

7. The magnetic memory device of claim 6, wherein a nitrogen content of the bottom pattern is higher than a metal element content of the bottom pattern.

8. The magnetic memory device of claim 1, wherein the bottom pattern includes,
   a first bottom pattern, and
   a second bottom pattern under the first bottom pattern.

9. The magnetic memory device of claim 8, wherein
   the first bottom pattern is a metal nitride layer, and
   the second bottom pattern is a metal layer.

10. The magnetic memory device of claim 9, wherein a thickness of the second bottom pattern along a height axis is less than a thickness of the first bottom pattern along the height axis.

11. The magnetic memory device of claim 8, wherein the bottom pattern includes a third bottom pattern under the second bottom pattern.

12. The magnetic memory device of claim 11, wherein a thickness of the third bottom pattern along a height axis is greater than a thickness of the first bottom pattern along the height axis.

13. The magnetic memory device of claim 11, wherein the third bottom pattern includes a sidewall having a stepped shape.

14. The magnetic memory device of claim 1, wherein the conductive line is configured to apply spin-orbit torque to the magnetic tunnel junction pattern.

15. The magnetic memory device of claim 1, wherein
   the magnetic tunnel junction pattern includes a set of layers that are sequentially stacked along a height axis, wherein the set of layers includes,
      a free layer,
      a tunnel barrier pattern, and
      a reference layer, and
   wherein the free layer is located between the tunnel barrier pattern and the conductive line.

16. A magnetic memory device comprising:
   a magnetic tunnel junction pattern on a substrate;
   a conductive line extending between the substrate and the magnetic tunnel junction pattern and in contact with a bottom surface of the magnetic tunnel junction pattern; and
   a bottom pattern located between the conductive line and the substrate and in contact with a bottom surface of the conductive line,
   wherein the bottom pattern includes a metal nitride, and
   wherein a nitrogen content of the bottom pattern is higher than a metal element content of the bottom pattern.

17. The magnetic memory device of claim 16, wherein the bottom pattern provides compressive stress to the conductive line.

18. The magnetic memory device of claim 16, wherein a ratio of the nitrogen content to the metal element content is substantially between 1.0 and 1.3.

19. The magnetic memory device of claim 16, wherein a second lattice constant of the bottom pattern is less than a first lattice constant of the conductive line.

20. The magnetic memory device of claim 16, wherein a grain density of the bottom surface of the conductive line is greater than a grain density of a top surface of the conductive line.

* * * * *